(12) United States Patent
Göbl et al.

(10) Patent No.: US 10,312,380 B2
(45) Date of Patent: Jun. 4, 2019

(54) SEMICONDUCTOR DIODE AND ELECTRONIC CIRCUIT ARRANGEMENT HEREWITH

(71) Applicant: SEMIKRON ELEKTRONIK GMBH & CO. KG, Nuremberg (DE)

(72) Inventors: Christian Göbl, Nuremberg (DE); Boris Rosensaft, Nuremberg (DE); Uwe Schilling, Uttenreuth (DE); Wolfgang-Michael Schulz, Zirndorf (DE); Sven Teuber, Nuremberg (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 15/866,948

(22) Filed: Jan. 10, 2018

(65) Prior Publication Data

US 2018/0233602 A1 Aug. 16, 2018

(30) Foreign Application Priority Data

Feb. 16, 2017 (DE) .......................... 10 2017 103 111

(51) Int. Cl.
| | |
|---|---|
| *H01L 29/82* | (2006.01) |
| *H01L 29/872* | (2006.01) |
| *H01L 29/06* | (2006.01) |
| *H01L 29/861* | (2006.01) |

(52) U.S. Cl.
CPC ........ *H01L 29/872* (2013.01); *H01L 29/0649* (2013.01); *H01L 29/0657* (2013.01); *H01L 29/8611* (2013.01); *H01L 2224/40225* (2013.01)

(58) Field of Classification Search
CPC .......................... H01L 29/872; H01L 29/0657
See application file for complete search history.

(56) References Cited

U.S. PATENT DOCUMENTS

| | | | | |
|---|---|---|---|---|
| 8,823,089 B2* | 9/2014 | Schulze | ............. | H01L 29/1606 257/331 |
| 9,536,803 B2* | 1/2017 | Sheridan | ............... | H01L 23/345 |
| 9,607,876 B2* | 3/2017 | Lidow | ................... | H01L 21/743 |
| 9,779,988 B2* | 10/2017 | Hill | ................... | H01L 21/76879 |

(Continued)

OTHER PUBLICATIONS

De 10 2017 103 111.1, German Examination Report dated Oct. 23, 2017, 5 pages—German, pages—English.

*Primary Examiner* — Ismail A Muse
(74) *Attorney, Agent, or Firm* — Lackenbach Siegel, LLP; Andrew F. Young

(57) ABSTRACT

A semiconductor diode includes a semiconductor body, having a first main area formed from an inner area, on which a first contact layer is arranged, and from an edge area, a current path from the first contact layer to a second contact layer arranged on a second main area situated opposite the first main area, wherein the semiconductor diode, by virtue of the configuration of the first contact layer or of the semiconductor body, is formed such that upon current flow, such current flows through a current path having the greatest heating per unit volume, and which proceeds from a further partial area of the inner area, wherein the further partial area is arranged on the other side of a boundary of an inner partial area of the inner area, said inner partial area preferably being arranged centrally, with respect to an outer partial area adjoining said inner partial area.

14 Claims, 3 Drawing Sheets

(56) References Cited

U.S. PATENT DOCUMENTS

| | | | |
|---|---|---|---|
| 9,929,284 B1* | 3/2018 | Zhang | H01L 29/872 |
| 2009/0001478 A1* | 1/2009 | Okamoto | H01L 21/76898 |
| | | | 257/382 |
| 2009/0008679 A1* | 1/2009 | Saito | H01L 29/0615 |
| | | | 257/199 |
| 2009/0166677 A1* | 7/2009 | Shibata | H01L 21/76251 |
| | | | 257/192 |
| 2010/0164062 A1* | 7/2010 | Wang | H01L 21/76898 |
| | | | 257/532 |
| 2011/0018109 A1* | 1/2011 | Blaschke | H01L 21/743 |
| | | | 257/659 |
| 2011/0210337 A1* | 9/2011 | Briere | H01L 21/8258 |
| | | | 257/76 |
| 2011/0227187 A1 | 9/2011 | Oonishi | |
| 2012/0139079 A1* | 6/2012 | Tokura | H01L 21/76283 |
| | | | 257/471 |
| 2012/0145995 A1* | 6/2012 | Jeon | H01L 21/8252 |
| | | | 257/20 |
| 2012/0161286 A1* | 6/2012 | Bhalla | H01L 27/0647 |
| | | | 257/577 |
| 2012/0223333 A1* | 9/2012 | Mizukami | H01L 29/1608 |
| | | | 257/77 |
| 2013/0146946 A1* | 6/2013 | Tsurumi | H01L 29/4175 |
| | | | 257/192 |
| 2013/0220396 A1* | 8/2013 | Janssen | H01L 31/02161 |
| | | | 136/244 |
| 2013/0288401 A1* | 10/2013 | Matsuura | H01L 22/10 |
| | | | 438/14 |
| 2014/0361382 A1* | 12/2014 | Schubert | H01L 21/76898 |
| | | | 257/401 |
| 2014/0367744 A1* | 12/2014 | Briere | H01L 21/8221 |
| | | | 257/195 |
| 2015/0011058 A1* | 1/2015 | Prechtl | H01L 29/66462 |
| | | | 438/172 |
| 2015/0318347 A1* | 11/2015 | Falck | H01L 29/0623 |
| | | | 257/170 |
| 2016/0104702 A1* | 4/2016 | Hsieh | H01L 29/7813 |
| | | | 257/334 |
| 2016/0268447 A1* | 9/2016 | Ritter | H01L 27/0262 |
| 2017/0062410 A1* | 3/2017 | Loechelt | H01L 27/0629 |
| 2017/0084715 A1* | 3/2017 | Lin | H01L 29/866 |
| 2017/0148783 A1* | 5/2017 | Bettencourt | H03F 1/56 |
| 2017/0338815 A1* | 11/2017 | Laven | H01L 29/872 |
| 2018/0108800 A1* | 4/2018 | Morimoto | B60W 30/00 |

* cited by examiner

SEMICONDUCTOR DIODE AND ELECTRONIC CIRCUIT ARRANGEMENT HEREWITH

CROSS REFERENCE TO RELATED APPLICATIONS

This application relates to and claims priority from, de 10 2017 103 111.1 filed Feb. 16, 2017, the entire contents of which are incorporated herein by reference.

FIGURE SELECTED FOR PUBLICATION

FIG. 4

BACKGROUND OF THE INVENTION

Field of the Invention

The invention describes a semiconductor diode, preferably a power semiconductor diode, and an electronic, preferably power electronic, circuit arrangement therewith.

Description of the Related Art

Semiconductor diodes comprising a pn junction in their semiconductor body are known from the generally known prior art. By way of example, said semiconductor diodes consist of a semiconductor material having a first doping with a well-shaped region having a second doping. The well-shaped region having a second doping is formed here by way of example proceeding from a section of the first main area of the semiconductor body and has a first metallic contact layer at its surface. The second main area, situated opposite the first main area, has a second metallic contact layer at its surface.

Schottky diodes comprising a metal-semiconductor junction and comprising metallic contact layers at opposite main areas are likewise routine in the art, in principle.

What is disadvantageous about both configurations of semiconductor diodes is that in circuit arrangements in which the semiconductor diodes are arranged on a substrate and in the event of a current flow between the first and second contact layers, the centre of the semiconductor diode is the partial area of the surface of the semiconductor diode having the greatest heating per unit volume, compared with all surrounding partial areas. This greatest heating usually stems from the fact that the dissipation of heat from the centre of the semiconductor diode can be carried out less efficiently than the dissipation of heat from the edge regions. This is often also accompanied by a higher power loss per unit volume.

ASPECTS AND SUMMARY OF THE INVENTION

According to one aspect of the present invention, there is provided a semiconductor diode including a semiconductor body, having a first main area formed from an inner area, on which a first contact layer is arranged, and from an edge area, a current path from the first contact layer to a second contact layer arranged on a second main area situated opposite the first main area, wherein the semiconductor diode, by virtue of the configuration of the first contact layer or of the semiconductor body, is formed such that upon current flow, such current flows through a current path having the greatest heating per unit volume, and which proceeds from a further partial area of the inner area, wherein the further partial area is arranged on the other side of a boundary of an inner partial area of the inner area, said inner partial area preferably being arranged centrally, with respect to an outer partial area adjoining said inner partial area.

According to another aspect of the present invention, there is provided a semiconductor diode having a semiconductor body, further having a first main area formed from an inner area, on which a first contact layer is arranged, and from an edge area, and comprising a current path from the first contact layer to a second contact layer arranged on a second main area situated opposite the first main area, wherein the semiconductor diode, by virtue of the configuration of the first contact layer or of the semiconductor body, is formed in such a way that upon current flow through the current path a partial current path, the one having the greatest heating per unit volume, and which proceeds from a further partial area of the inner area, is formed, wherein the further partial area is arranged on the other side of a boundary of an inner partial area of the inner area, said inner partial area preferably being arranged centrally, that is to say around a centre axis or a centre position, with respect to an outer partial area adjoining said inner partial area, and is formed as part of said outer partial area.

With knowledge of the circumstances mentioned, the invention is based on the object of presenting a semiconductor diode and a circuit arrangement therewith in which, during operation, the centre of the semiconductor diode is heated to a lesser extent in comparison with the prior art.

This object is achieved according to the invention by means of a semiconductor diode having the features as claimed herein.

The volume-conductive semiconductor diode according to the invention is formed comprising a semiconductor body, comprising a first main area formed from an inner area, on which a first contact layer is arranged, and from an edge area, and comprising a current path between the first contact layer and a second contact layer, arranged on a second main area situated opposite the first main area, wherein the semiconductor diode, by virtue of the configuration of the first contact layer or of the semiconductor body, is formed in such a way that upon current flow through the current path a partial current path is formed by a further partial area of the inner area, specifically by the one having the greatest heating per unit volume, wherein said further partial area of the inner area and thus of the semiconductor diode is not arranged in the centre thereof, that is to say in a manner surrounding a centre axis or a centre position.

The first and second contact layers are preferably formed in accordance with the prior art mentioned above.

Preferably, the semiconductor diode is formed with a pn junction in the semiconductor body or as a Schottky diode, comprising a Schottky junction. The semiconductor diodes according to the invention do not explicitly have a cell structure such as is known for example from IGBTs (Insulated Gate Bipolar Transistor). However, the basic concept can indeed also be applied to diodes comprising a cell structure, wherein a semiconductor diode according to the invention is likewise formed.

In one preferred configuration, the inner partial area has a partial area contour which is round or square, or is formed at least substantially identically with respect to an outer contour of the semiconductor diode. The outer contour can be formed arbitrarily here, in principle. It is often formed in a round, square or rectangular fashion, but hexagonal outer contours, for example, are also known and able to realized.

It is preferred if the inner partial area has an areal extent which is a maximum of 25%, preferably a maximum of 15%, and a minimum of 3%, preferably a minimum of 10%, of the area of the inner area.

Preferably, the further partial area is formed on the other side of a boundary of an inner partial area of the inner area with respect to an outer partial area adjoining said inner partial area, and is formed as part of said outer partial area.

It is preferred here if the inner partial area is formed and delimited by one of the following variants, which need not necessarily be alternative:

The inner area is cut out in the centre of the first contact layer. This embodiment preferably proves also to be applicable to diodes comprising a cell structure.

The inner area has in the centre a plurality of cutouts in the first contact layer, wherein the surface area of said cutouts is more than 50%, preferably more than 75%, in particular preferably more than 90%, of the inner partial area.

The first contact layer above the inner partial area has a higher ohmic resistance than the contact layer of the adjoining partial area.

An electrically insulating layer, preferably a semiconductor oxide of the semiconductor body, is arranged in the region of the inner partial area. Said insulating layer can also be covered by the first contact layer. This embodiment likewise proves to be preferably applicable to diodes comprising a cell structure.

No part of the pn junction is arranged in a region below the inner partial area.

In a region below the inner partial area a doping concentration is present which is lower than that doping concentration below the adjoining outer partial area.

A region below the inner partial area is irradiated with electrons and/or ions in such a way that, for example, the ohmic resistance increases.

It is furthermore preferred if the ratio of the lateral extent along the main areas to the thickness of the semiconductor diode, that is to say the distance between the main areas, is at least 5 to 1, preferably at least 10 to 1.

The circuit arrangement according to the invention is formed comprising a semiconductor diode described above, comprising a substrate and comprising a connection device, wherein the first contact layer of the semiconductor diode is electrically conductively connected to a further part of the circuit arrangement by means of the connection device.

Preferably, the connection device is formed as a wire bond connection or as a flexible or rigid planar metal shaped body.

It can be advantageous if the further part of the circuit arrangement is formed as a terminal element, or as a power semiconductor component or as a conductor track of the substrate.

It goes without saying that the various configurations of the invention, that is to say of the semiconductor diode, and also of the circuit arrangement therewith, can be realized individually or in arbitrary combinations in order to achieve improvements. In particular, the features above and explained here or hereinafter can be used not only in the combinations indicated, but also in other, non-mutually exclusive combinations or by themselves, without departing from the scope of the present invention.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
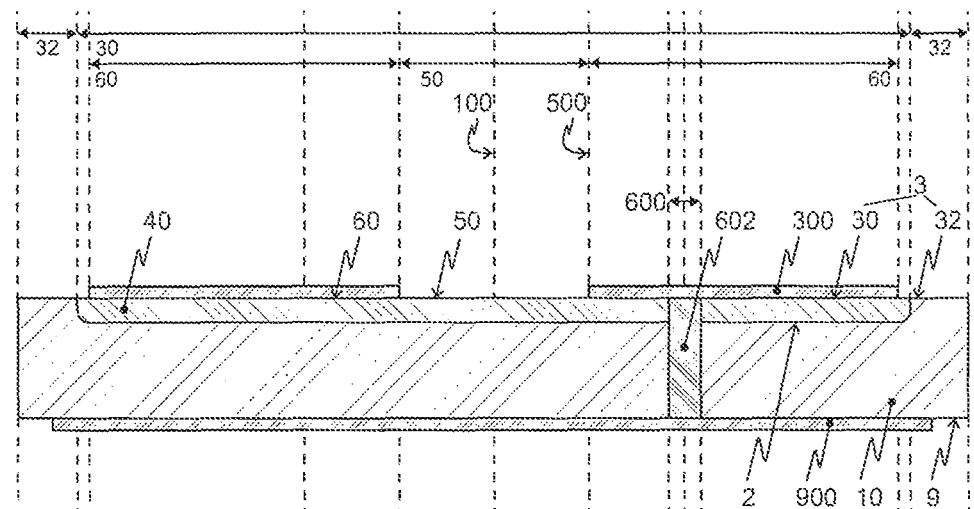
FIGS. 1 to 3 show three variants of semiconductor diodes according to the invention in lateral sectional view through the centre thereof.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms, do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

It will be further understood by those of skill in the art that the apparatus and devices and the elements herein, without limitation, and including the sub components such as operational structures, circuits, communication pathways, and related elements, control elements of all kinds, display circuits and display systems and elements, any necessary driving elements, inputs, sensors, detectors, memory elements, processors and any combinations of these structures etc. as will be understood by those of skill in the art as also being identified as or capable of operating the systems and devices and subcomponents noted herein and structures that accomplish the functions without restrictive language or label requirements since those of skill in the art are well versed in related fields of semiconductor diodes and electronic circuit arrangements and all their sub components, including various circuits and combinations of circuits and structures without departing from the scope and spirit of the present invention.

Figure 2:
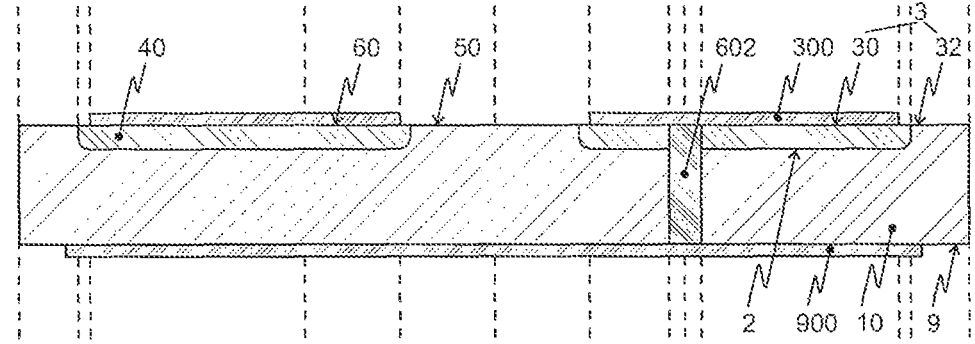
Figure 3:
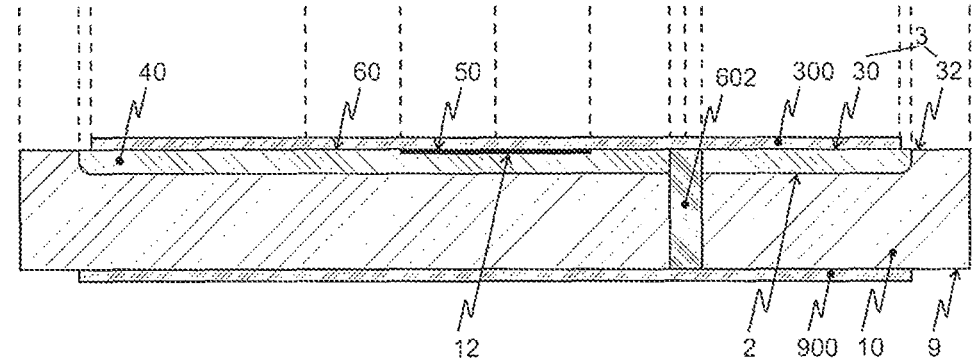

FIGS. 1 to 3 show three variants of semiconductor diodes according to the invention in lateral sectional view through the centre thereof. Each of said semiconductor diodes comprises a semiconductor body 10 having a first doping, here an n-type doping. In the semiconductor body 10, in each case symmetrically with respect to the centre thereof, there is formed a well 40, in FIGS. 1 and 3 a well 40 formed in a manner that is routine in the art, and in FIG. 2 a virtually ring-shaped well 40 omitting the centre, more precisely the region around the centre axis or centre position 100, having a second doping, here a p-type doping. Consequently, in each case a pn junction 2 is formed between the first doping and the second doping. The respective semiconductor body 10 has a first and an oppositely arranged second main area 3, 9, wherein here the well 40 having the second doping is arranged in a manner preceding from the first main area 3.

The first main area 3 consists of an inner area 30 arranged centrally around the centre axis or centre position 100 of the semiconductor diode, and an edge area 32 extending to said inner area and to the edge. Field rings for a field ring structure comprising field rings and field plates covering the latter can be arranged in the region of the edge area 32 in a manner in accordance with the prior art, but not illustrated here. A first contact layer 300 is arranged on the inner area 30 and here in a manner not completely covering the latter, said first contact layer being formed as a multilayer metal contact layer in a manner that is routine in the art. A second contact layer 900 is arranged on the second main area 9 and here in a manner not completely covering the latter, said second contact layer being formed as a multilayer metal contact layer in a manner that is routine in the art. In a manner that is routine in the art, the two contact layers 300, 900 are not necessarily formed identically, that is to say with the same layer sequence. Rather, the two contact layers differ in their construction on account of the different connection methods which are intended to be realized with said contact layers. Here, purely by way of example, soldering connections, sintering connections or else, especially for the first contact layer, wire bond connections are customary. This results, in principle, in a volume-conductive semiconductor diode for a current flow between the first and second contact layers 3, 9.

In accordance with a first configuration of the invention in accordance with FIG. 1, the first contact layer 300 is not formed over the whole area, but rather has a cutout centrally. Consequently, also of FIG. 4, this results in an inner partial area 50 of the inner area 30 which is cut out in the centre of the first contact layer 300. Said inner partial area 50 is adjoined by an outer partial area 60, which is completely covered with the first contact layer 300 and extends close to the edge of the inner area 50. This is generally necessary since the first contact layer 300 is permitted to be in electrically conductive contact only with the region, the well 40, having the second doping and for this purpose must be spaced from the edge of the well 40, that is to say from the pn junction 2, which here extends to the first main area 3.

It is possible, although not illustrated, also to arrange a further metallization, formed in any desired manner in principle, in the inner region 50. However, during the operation of the semiconductor diode, said further metallization is not electrically conductively connected and thus does not contribute to the current flow between the first and second contact layers 300, 900.

In accordance with a second configuration of the invention in accordance with FIG. 2, the first contact layer 300 is formed in principle identically to that in accordance with FIG. 1. In addition, here the well 40 having the second doping also has a lateral extent, that is to say extent here lying in the plane of the first main area 3, identical to the first contact layer 300, wherein, as explained above, not only is the outer edge of the first metallization 300 spaced apart from the pn junction 2, but so is the inner edge of the first contact layer 300, for the same reason. Consequently, the first contact layer covers the p-type well region 40 and in this case leaves an edge strip of the p-type well region 40 uncovered both at the inner location and at the outer location.

In accordance with a third configuration of the invention in accordance with FIG. 3, the inner partial area 50 is formed and delimited by virtue of the fact, that an electrically insulating layer, here a semiconductor oxide 12, formed by oxidation of the semiconductor body 10, is arranged in the region of the inner partial area 50. The insulating layer should have at least an ohmic resistance which is greater than that of the region, the well 40, having the second doping by two, better by four, orders of magnitude. The insulating layer can also be applied on the semiconductor body 10 by means of an epitaxy method. It is particularly advantageous, on account of the simple production, to form the first contact layer 300 here over the whole area, virtually analogously to the prior art, wherein the insulating layer is completely covered here by the first contact layer 300.

For all configurations of the semiconductor diode mentioned it holds true that according to the invention, in the event of current flow between the first contact layer 300 and the second contact layer 900, a partial current path 602 having the greatest heating per unit volume is assigned to a further partial area 600 of the inner area 30. Said further partial area 600 is formed on the other side of a boundary 500 of the inner partial area 50 as part of the outer partial area. Said further partial area 600 defines the position of the unit of volume having the greatest heating during operation, wherein the unit of volume, proceeding from the further partial area 600 of the first main area 3, extends into the semiconductor body 10 as far as the second main area 9.

Figure 4:
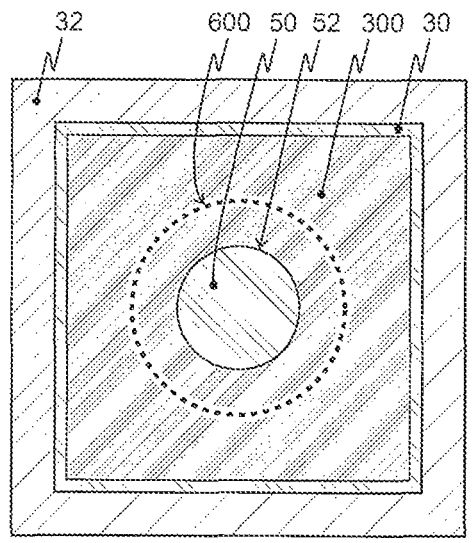
FIGS. 4 to 6 show three variants of semiconductor diodes according, to the invention in plan view.
Figure 5:
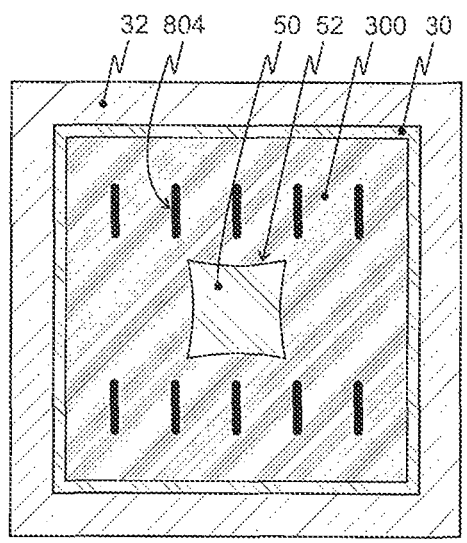
Figure 6:
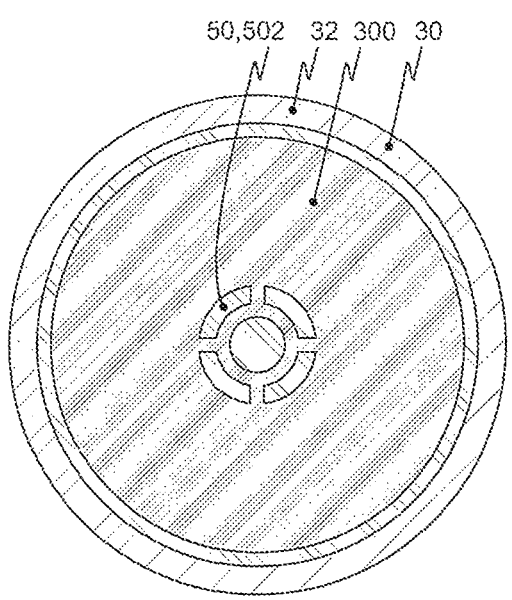

FIGS. 4 to 6 show three variants of semiconductor diodes according to the invention.

FIGS. 4 and 5 show semiconductor diodes in accordance with FIG. 1 or FIG. 2 in plan view. Each illustration shows the first main area 3, formed from the inner area 30 and the edge area 32. The inner area 30 has centrally an inner partial area 50 having no contact layer. Said inner partial area 50 is surrounded by an outer partial area 60 having the first metallization 300.

FIG. 4 purely schematically shows the further partial area 600 of the outer partial area 60, which is arranged on the other side of the boundary 500 between inner and outer partial areas 50, 60 and is assigned to the partial current path having the greatest heating per unit volume.

The inner partial area 50 of this semiconductor diode has a round partial area contour 52.

FIG. 5 shows a semiconductor diode having a cushion-shaped partial area contour 52 substantially following the here square outer contour. The illustration furthermore shows contact regions 804 of a wire bond connection to which the first contact layer 300 of the semiconductor diode can be electrically conductively connected in the context of a circuit arrangement, cf. FIG. 7.

FIG. 6 shows a round semiconductor diode, wherein in the centre a plurality of cutouts 502 are arranged in the first contact layer 300, thereby defining the inner partial area 50. The surface area of said cutouts 502 here is more than 50% of the surface area of the inner partial area 50.

Figure 7:
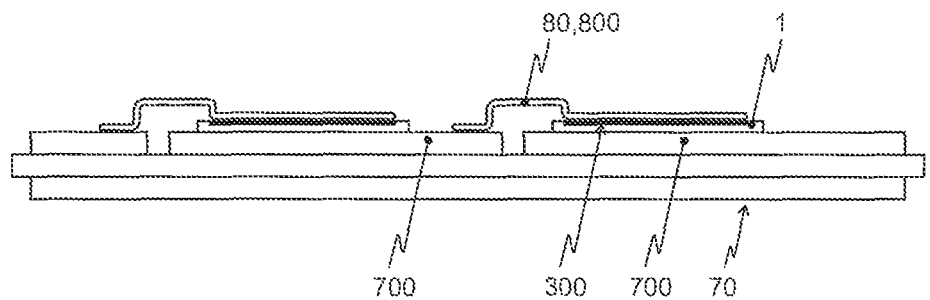
FIG. 7 shows a circuit arrangement according to the invention.

FIG. 7 shows a circuit arrangement according to the invention comprising a semiconductor diode 1, comprising a substrate 70 and comprising a connection device 80. The substrate 70 comprises an insulating layer or alternatively an insulating-substance body in each case with conductor tracks 700 arranged thereon. This is a substrate that is routine in the art, for example a so-called DCB (Direct Copper Bonding) substrate, such as is routine for example for power semiconductor modules. The second contact layer 900 of the semiconductor diode 1 is electrically conductively connected to a conductor track 700 in a force-locking or materially bonded manner, for example by means of a soldering connection, in a manner that is routine in the art. The first contact layer 300 of the semiconductor diode 1 is electrically conductively connected to a further conductor track 700 of the circuit arrangement, more precisely of the substrate 70, by means of a connection device 80. Said connection device 80 is likewise formed in a manner that is routine in the art, here as a metal clip 800, but can also be formed as an electrically conductive film or as a wire bond connection.

Figure 8:
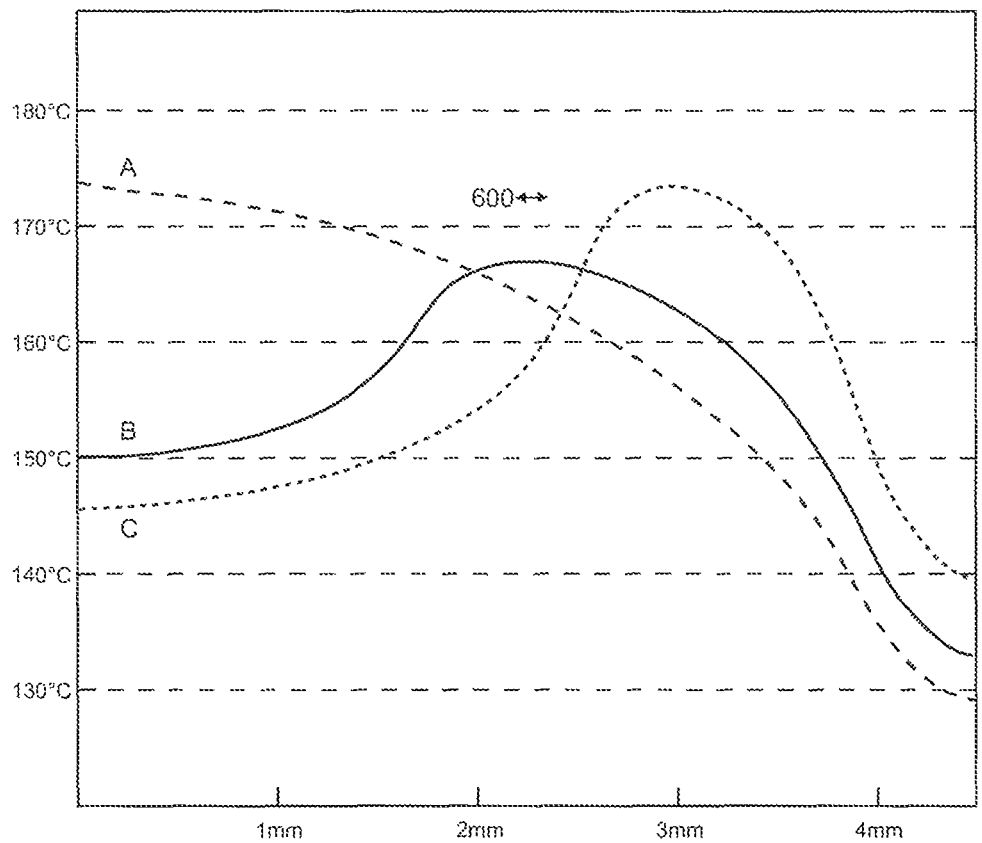
FIG. 8 shows temperature profiles of various semiconductor diodes from the respective centre to the edge of the respective semiconductor diode upon the application thereof in a circuit arrangement.

FIG. 8 shows temperature profiles of various semiconductor diodes from the respective centre to the edge of the respective semiconductor diode upon the application thereof in a circuit arrangement. Curve A here shows the temperature profile of a semiconductor diode in accordance with the prior art. Such a semiconductor diode heats up to the greatest extent in its centre because the heat dissipation from this region, to a substrate or a heat sink is the least efficient. This results here in a maximum temperature of above 173° C., and thus the region having the greatest heating per unit volume, in the centre of the semiconductor diode.

In the case of an optimized configuration, in accordance with curve B, of the semiconductor diode according to the invention, the region having the highest temperature during operation, that is to say the volume region which, extending into the semiconductor body, adjoins the further partial area, is shifted in the direction of the edge of the semiconductor diode, even though the effective cross-sectional area of the semiconductor diode is reduced compared with the prior art by virtue of the abovementioned measures according to the invention, for example in accordance with FIGS. 1 to 3. What is essential here is that by virtue of the configuration of the semiconductor diode according to the invention, now only a maximum temperature of 167° C. is established in the region having, the greatest heating per unit volume.

Curve C shows an instance where the region having the greatest heating per unit volume is shifted "too far" in the direction of the edge of the semiconductor diode. In this case, only the cross-sectional area of the semiconductor diode that is effective for the current flow between the first and second metal layers is reduced to such an extent that the maximum temperature rises again.

The optimization of the concrete configuration of the semiconductor diode can be carried out on the basis of thermal simulations or be determined empirically. Significant influencing variables are the thickness, and also the width, that is to say the lateral extent, of the semiconductor diode, the dopings thereof and hence also the design thereof for different voltage classes.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they conic within the scope of the appended claims and their equivalents.

What is claimed is:

1. A volume-conductive semiconductor diode, comprising: a semiconductor body, the semiconductor body comprising:
    a first main area formed from an inner area, on which a first contact layer is arranged, and from an edge area of said first main area, providing a current path extending through the semiconductor body contacting a surface of the first contact layer and a surface of a second contact layer, wherein the second contact layer is arranged on a second main area situated opposite the first main area;
    a pn junction;
    wherein the volume-conductive semiconductor diode is configured to, upon a current flow through said current path, defines a partial current path formed by a further partial area of the inner area, have a greater heating per unit volume during a use as compared to when it is not used;
    wherein said further partial area of the inner area of the volume-conductive semiconductor diode is not arranged in an inner partial area defined as surrounding and proximate a central position of said semiconductor body; and
    wherein the inner partial area has a partial area contour which is formed to include at least a first shape selected from the group consisting of: round, square, and substantially similar to outer contour of the volume-conductive semiconductor diode.

2. The volume-conductive semiconductor diode, according to claim 1, wherein;
    the inner partial area has an areal extent of the area of the inner area; and
    said areal extent is a maximum of 25% of said area and a minimum of 3% of said area.

3. The volume-conductive semiconductor diode, according to claim 1, wherein;
    the further partial area is formed on the other side of a boundary of the inner partial area of the inner area from an outer partial area adjoining said inner partial area, and is formed as part of said outer partial area.

4. The volume-conductive semiconductor diode, according to claim 3, wherein;
    the inner partial area is formed and delimited by the inner area being cut out in a center of the first contact layer.

5. The volume-conductive semiconductor diode, according to claim 3, wherein;
    the inner partial area is formed and delimited by the inner area having a plurality of cutouts in the first contact layer; and
    wherein a defined surface area of said plurality of cutouts is more than 50% of the inner partial area.

6. The volume-conductive semiconductor diode, according to claim 3, wherein;

the inner partial area is formed and delimited by the first contact layer above the inner partial area having a higher ohmic resistance than the contact layer of an adjoining outer partial area.

7. The volume-conductive semiconductor diode, according to claim 3, wherein;
the inner partial area is formed and delimited by an electrically insulating layer arranged proximate said inner partial area; and
said electrically insulating layer is a semiconductor oxide.

8. The volume-conductive semiconductor diode, according to claim 3, wherein:
the inner partial area is formed and delimited so that no part of the pn junction is arranged in a region proximate and below said inner partial area.

9. The volume-conductive semiconductor diode, according to claim 3, wherein;
the inner partial area is formed and delimited so that in a region defined proximate and below said inner partial area a first doping concentration is present which is lower than a second doping concentration that is proximate and, below the adjoining outer partial area.

10. The volume-conductive semiconductor diode, according to claim 1, wherein:
a ratio of a lateral extent along the first and second main areas to a thickness of the volume-conductive semiconductor diode, is at least 5-to-1.

11. A circuit arrangement, comprising:
the volume-conductive semiconductor diode according to claim 1, further comprising:
a substrate; and
a connection device, wherein the first contact layer of the volume-conductive semiconductor diode is electrically conductively connected to a further part of the circuit arrangement by means of the connection device.

12. The circuit arrangement, according to claim 11, wherein:
the connection device is formed as at least one of a wire bond connection, a flexible shaped body, and a rigid planar metal shaped body.

13. The circuit arrangement, according to claim 11, wherein:
said further part of the circuit arrangement is formed as one of a terminal element, a power semiconductor component, and a conductor track of the substrate.

14. The volume-conductive semiconductor diode, according to claim 1, wherein:
the semiconductor body further comprises a Schottky Junction.

* * * * *